United States Patent
Yurzola et al.

(10) Patent No.: US 8,533,558 B2
(45) Date of Patent: Sep. 10, 2013

(54) SYSTEM AND METHOD OF ERROR CORRECTION OF CONTROL DATA AT A MEMORY DEVICE

(75) Inventors: Damian Pablo Yurzola, Santa Clara, CA (US); Rajeev Nagabhirava, Santa Clara, CA (US); Arjun Kapoor, San Francisco, CA (US); Itai Dror, Omer (IL); Annie Chi-San Chang, Sunnyvale, CA (US); Peter Hwang, Newark, CA (US); Jian Chen, Menlo Park, CA (US)

(73) Assignee: Sandisk Technologies Inc., Plano, TX (US)

( * ) Notice: Subject to any disclaimer, the term of this patent is extended or adjusted under 35 U.S.C. 154(b) by 215 days.

(21) Appl. No.: 12/955,174

(22) Filed: Nov. 29, 2010

(65) Prior Publication Data

US 2011/0154158 A1    Jun. 23, 2011

Related U.S. Application Data

(63) Continuation of application No. 12/645,700, filed on Dec. 23, 2009.

(51) Int. Cl.
*G06F 11/00* (2006.01)

(52) U.S. Cl.
USPC .......................... 714/758; 714/766; 714/779

(58) Field of Classification Search
USPC ................................. 714/758, 779, 763, 766
See application file for complete search history.

(56) References Cited

U.S. PATENT DOCUMENTS

| | | | |
|---|---|---|---|
| 4,688,225 A | * | 8/1987 | Fukami et al. ................ 714/755 |
| 5,200,962 A | | 4/1993 | Kao et al. |
| 5,357,614 A | | 10/1994 | Pattisam et al. |
| 5,394,534 A | | 2/1995 | Kulakowski et al. |
| 5,459,850 A | | 10/1995 | Clay et al. |
| 5,771,081 A | | 6/1998 | Lee |
| 5,926,612 A | | 7/1999 | Gillard et al. |

(Continued)

FOREIGN PATENT DOCUMENTS

| EP | 0915413 A1 | 12/1999 |
|---|---|---|
| WO | 2008070173 A1 | 6/2008 |

OTHER PUBLICATIONS

International Search Report and Written Opinion dated Jun. 6, 2011, issued in International Application No. PCT/US2010/058591, 15 pages.

(Continued)

*Primary Examiner* — Bryce Bonzo
*Assistant Examiner* — Elmira Mehrmanesh
(74) *Attorney, Agent, or Firm* — Toler Law Group, PC

(57) ABSTRACT

A method includes initiating a compression operation to compress data to be stored in a group of storage elements at a memory device that includes an error correction coding (ECC) engine. The method includes selecting one of a first mode of the ECC engine to generate a first number of parity bits and a second mode of the ECC engine to generate a second number of parity bits based on an extent of compression of the data. The method also includes encoding the compressed data to generate parity bits corresponding to the compressed data and storing the compressed data and the parity bits to the group of storage elements according to a page format that includes a data portion and a parity portion. The compressed data is stored in the data portion and at least some of the parity bits are stored in the parity portion.

21 Claims, 6 Drawing Sheets

(56) References Cited

U.S. PATENT DOCUMENTS

| | | | |
|---|---|---|---|
| 6,145,067 | A | 11/2000 | Kuwata |
| 6,145,069 | A | 11/2000 | Dye |
| 6,370,324 | B1 | 4/2002 | Kawahara et al. |
| 6,470,142 | B1 | 10/2002 | Isozaki et al. |
| 6,526,224 | B1 * | 2/2003 | Kawahara et al. ............ 386/328 |
| RE38,481 | E | 3/2004 | Yonemitsu et al. |
| 6,718,443 | B2 | 4/2004 | Yoshida |
| 6,754,277 | B1 * | 6/2004 | Heinzelman et al. .... 375/240.27 |
| 6,862,662 | B1 | 3/2005 | Cloud |
| 6,961,890 | B2 | 11/2005 | Smith |
| 7,051,152 | B1 | 5/2006 | Danilak |
| 7,058,769 | B1 | 6/2006 | Danilak |
| 7,644,342 | B2 * | 1/2010 | Shibata ........................ 714/773 |
| 7,673,215 | B2 * | 3/2010 | Wybenga et al. ............. 714/758 |
| 7,929,794 | B2 | 4/2011 | Laffoley |
| 7,941,409 | B2 | 5/2011 | Mimatsu |
| 8,131,927 | B2 | 3/2012 | Kawaguchi |
| 2003/0014716 | A1 | 1/2003 | Ariel |
| 2004/0139380 | A1 * | 7/2004 | Sako ............................ 714/758 |
| 2004/0228197 | A1 | 11/2004 | Mokhlesi |
| 2005/0251632 | A1 | 11/2005 | Hsieh |
| 2006/0036897 | A1 | 2/2006 | Lin et al. |
| 2007/0016724 | A1 | 1/2007 | Gaither et al. |
| 2007/0230698 | A1 | 10/2007 | Shamoon |
| 2008/0062775 | A1 | 3/2008 | Oh |
| 2008/0148004 | A1 | 6/2008 | Iren et al. |
| 2010/0281340 | A1 * | 11/2010 | Franceschini et al. ........ 714/763 |

OTHER PUBLICATIONS

Non-Final Office Action mailed May 1, 2012 in U.S. Appl. No. 12/645,700, 12 pages.

Tremaine, R. B. et al. "IBM Memory Expansion Technology (MXT)," IBM Journal of Research and Development, vol. 45, No. 2, Mar. 2001, pp. 271-285.

Abali, Bulent et al. "Performance of Hardware Compressed Main Memory," IBM Research Report, IBM T.J. Watson Research Center, Jul. 19, 2000, 13 pages.

Invitation to Pay Additional Fees and, Where Applicable, Protest Fee and Partial International Search Report issued by the European International Searching Authority in International Application No. PCT/US2010/058591 on Mar. 22, 2011, 7 pages.

Final Office Action mailed Dec. 7, 2012 issued in U.S. Appl. No. 12/645,700, 11 pages.

Benveniste, C.D. et al., Abstract of "Cache-memory interfaces in compressed memory systems," IEEE Transactions on Computers, vol. 50, Issue 11, Nov. 2001, 1 page.

Notice of Allowance and Fee(s) Due mailed Apr. 8, 2013 in U.S. Appl. No. 12/645,700, 6 pages.

* cited by examiner

SYSTEM AND METHOD OF ERROR CORRECTION OF CONTROL DATA AT A MEMORY DEVICE

CROSS-REFERENCE TO RELATED APPLICATIONS

The present disclosure is a continuation of, and claims priority from U.S. patent application Ser. No. 12/645,700, filed on Dec. 23, 2009, the content of which is expressly incorporated by reference herein in its entirety.

FIELD OF THE DISCLOSURE

The present disclosure is generally related to error correction of control data at a memory device.

BACKGROUND

During the process of writing data into memory, the data is often encoded with extra bits to form a codeword. In the presence of noise, some of the bits representing the codeword may change, corrupting the original codeword with errors. When the codeword is read from the memory, a decoder may be used to identify and correct the errors using error correction coding (ECC). For example, Bose-Chaudhuri-Hocquenghem (BCH), Low Density Parity Check (LDPC), Reed Solomon and Turbo Coding Schemes are commonly used in applications where bit errors tend to be uncorrelated.

Hardware and software implementations of ECC algorithms are usually defined to be able to correct a given amount of errors over a given length of data. If a storage media returns data with more errors than an ECC engine is designed to be able to correct, the decoded data will not match the originally stored data. Thus, improving the error correction capabilities of the ECC engine of a memory device may improve the reliability of the memory device.

SUMMARY

An error correction coding (ECC) enhancement compression module is disclosed that can improve the error correction capabilities of an ECC engine of a memory device. The ECC enhancement compression module enhances error correction of control data by compressing the control data before the control data is encoded, thus reducing the number of control data bits that need to be encoded and decoded by the ECC engine. Reducing the number of bits that represent the control data enables the ECC engine to focus its correction capability on fewer bits and therefore more errors are correctable than if the control data were uncompressed. As a result, the effective error correction capabilities of the ECC engine are enhanced.

DETAILED DESCRIPTION

Figure 1:
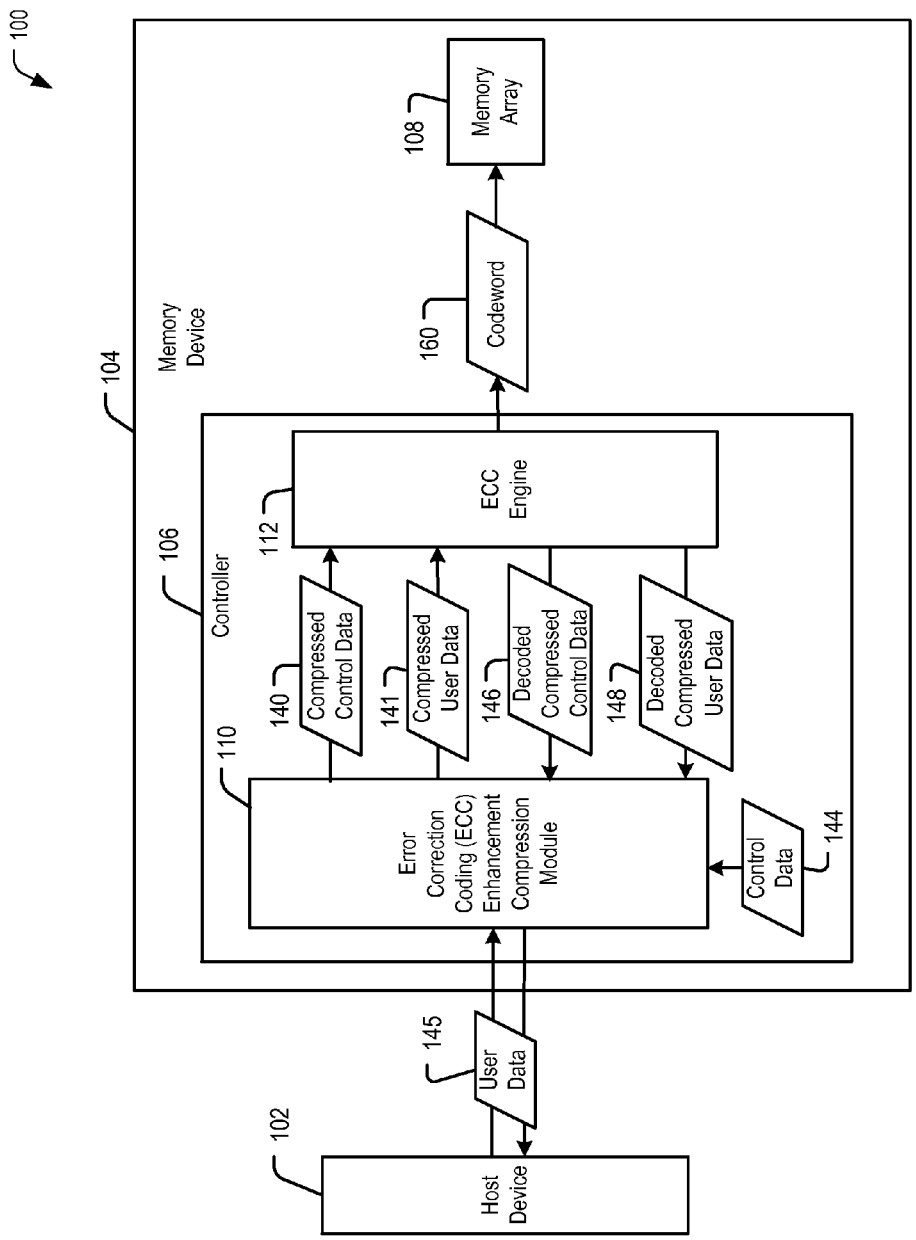
FIG. 1 is a block diagram of a particular illustrative embodiment of a system that includes a memory device with an error correction coding (ECC) enhancement compression module.

Referring to FIG. 1, a particular embodiment of a system including an ECC enhancement compression module 110 is depicted and generally designated 100. The system 100 includes a host device 102 coupled to a memory device 104. The memory device 104 includes a controller 106 coupled to a memory array 108. The controller 106 includes the ECC enhancement compression module 110 coupled to an ECC engine 112. The ECC enhancement compression module 110 is configured to compress control data 144 and to provide compressed control data 140 to the ECC engine 112 for encoding as a codeword 160 to be stored at the memory array 108. By compressing the control data 144 prior to encoding, an effective error correction rate of the compressed control data 140 due to the encoding at the ECC engine 112 is enhanced as compared to a non-compressed encoding of the control data 144.

The ECC enhancement compression module 110 may be configured to receive and compress the control data 144 to be provided to the ECC engine 112 for encoding. For example, the ECC enhancement compression module 110 may include a processor executing compression software, such as instructions to execute a "zlib" compression algorithm or one or more other algorithms, to perform compression of the control data 144. Compression module 110 can be accelerated by a dedicated hardware compression circuit. The ECC enhancement compression module 110 may be configured to provide the compressed control data 140 to the ECC engine 112. In addition, the ECC enhancement compression module 110 may be configured to receive user data 145 from the host device 102. The ECC enhancement compression module 110 may be configured to perform a compression of the user data 145 and to provide compressed user data 141 to the ECC engine 112 to be encoded for storage at the memory array 108.

The ECC engine 112 may include circuitry to receive input data (e.g., the compressed control data 140) and to generate one or more codewords (e.g., the codeword 160) representing an encoding of the input data. For example, the ECC engine 112 may be configured to utilize a Reed-Solomon encoding, a BCH code, a low density parity check (LDPC) code, one or more other error detection and correction codes, or any combination thereof. Although the ECC engine 112 is described as being performed by dedicated hardware circuitry, in other embodiments the ECC engine 112 may include one or more processors executing executable instructions to perform at least a portion of an encoding or decoding function.

The memory array 108 may be responsive to the controller 106 to store and retrieve data in response to instructions from the controller 106. For example, the memory array 108 may be responsive to the controller 106 to perform a data write operation at the memory array 108. For example, the codeword 160 received from the ECC engine 112 may be provided to the memory array 108 as a data write operation from the controller 106. The codeword 160 may be stored at the memory array 108 for later retrieval by the controller 106. The memory array 108 may be a non-volatile memory, such as a flash memory.

The host device 102 may be a device external to the memory device 104. For example, the host device 102 may be a portable electronic device, such as a mobile handset, and the memory device 104 may be a flash memory card coupled to or installed within the host device 102.

During operation, the host device 102 may provide the user data 145 to the memory device 104 for storage at the memory array 108. The user data 145 may be received at the controller 106 and may be provided to the ECC enhancement compression module 110. In addition, the controller 106 may also generate control data (e.g., the control data 144) useful for the operation of the memory device 104. For example, the controller 106 may use the control data 144 to perform logical-to-physical address mapping, calculate erase counts, determine status information corresponding to the memory device 104, or any combination thereof. For example, the control data 144 may include logical block address tables and physical block address tables that map logical addresses to physical addresses within the memory array 108. The control data 144 may also include indices, pointers, and offsets for data structures at the memory array 108, wear leveling data for the memory device 104, other control data, or any combination thereof. The control data 144 may or may not correspond to the user data 145 and may or may not be synchronous in time with the user data 145 (i.e., the control data 144 may have been generated at a substantially different time from the time of receipt of the user data 145). The control data 144 may be separate from the user data 145. Alternatively, the control data 144 may be interleaved with or appended to the user data 145 to be compressed at the ECC enhancement compression module 110.

Data compressed at the ECC enhancement compression module 110 (e.g., the control data 144 and the user data 145) may be provided to the ECC engine 112 for encoding, and coded data output (e.g., the codeword 160) from the ECC engine 112 may be stored at the memory array 108. The ECC engine 112 may operate to encode the compressed control data 140. By operating the ECC engine 112 to perform a full encoding operation on data having reduced data size due to the pre-encoding compression, an effective correction capability of the ECC encoding may be achieved.

For example, the ECC enhancement compression module 110 may compress the control data 144 according to a compression ratio (CR). The (CR) may be defined as:

$$CR = \frac{SizeofCompressedControlData}{SizeofControlData}$$

The ECC engine 112 may detect and correct errors according to an error correction ratio (ECR). The (ECR) may be defined as:

$$ECR = \frac{CorrectableBitsNumber}{8*(SizeofControlData)}$$

The (CorrectableBitsNumber) may be a number of bits that the ECC engine 112 can correct in a data word having the size in bytes (SizeofControlData). Compressing the control data 144 may impact the (ECR) of the ECC engine 112. For example, applying the compressed control data 140 to the ECC engine 112 may result in an (ECR') defined as:

$$ECR' = \frac{CorrectableBitsNumber}{8*CompressionRatio*SizeofControlData}$$

For example, the ECC engine 112 may be designed to correct a maximum of 12 bits (i.e., (CorrectableBitsNumber)) per 512 bytes of control data 144. The corresponding ECR (CorrectableBitsNumber=12) is approximately 2.9 E-3. If a compression ratio (CR) of 50% is applied to the control data 144, then the size of the compressed control data 140 would be 256 bytes and the corresponding ECR' would be approximately 5.9E-3. Thus, improving (i.e., reducing) the compression ratio applied by the ECC enhancement compression module 110 may increase the error correction capabilities of the ECC engine 112.

Compressing the control data 144 may enable the ECC engine 112 to use a less powerful correction algorithm (e.g., having a lower value of (CorrectableBitsNumber)) to achieve the same error correction rate. For example, as defined above, an ECR' of an ECC engine applying 6-bit correction to control data compressed at 50% may equal an ECR of an ECC engine applying 12-bit correction to control data that is not compressed, as expressed as:

ECR'(CorrectableBitsNumber=6; CR=0.5)=ECR(CorrectableBitsNumber=12).

The user data 145 received from the host device 102 may be compressed prior to being received at the memory device 104, and as a result the ECC enhancement compression module 110 may not be able to significantly improve a compression of the user data 145. However, the control data 144 may not be compressed prior to being received at the ECC enhancement compression module 110. Compressing control data 144 (i.e., generating the compressed control data 140) provided to the ECC engine 112 may represent a significant reduction in size from the original control data 144 and may provide a corresponding improvement in an effective error correction ratio of the ECC engine 112.

The codeword 160 may be retrieved from the memory array 108 and may be decoded by the ECC engine 112. The ECC engine 112 may detect and correct a number of errors that may have occurred during storage at the memory array 108 or transmission to the controller 106. The original encoding of the compressed control data 140 may use the full ECC capability of the ECC engine 112 on a reduced data size, thus the error correction of the control data 144 may be enhanced. The resulting decoded compressed control data may be provided to the ECC enhancement compression module 110. The ECC enhancement compression module 110 may decompress decoded compressed control data 146 received from the ECC engine 112 for use at the controller 106 as the control data 144. In addition, the ECC engine 112 may decode compressed user data stored at the memory array 108 and provide the decoded compressed user data 148 to the ECC enhancement compression module 110. The ECC enhancement compression module 110 may decompress the decoded compressed user data 148 to generate user data 145 to be sent to the host device 102.

Compressing the control data 144 may enable the error correction capabilities of the ECC engine 112 to be increased by narrowing the area of correction efforts. An effective error correction rate of the compressed control data 140 at the ECC engine 112 may exceed an effective error correction rate of the control data 144. Thus, as a frequency of error occurrence in the memory array 108 may increase over time, the life expectancy of the memory device 104 may be extended due to the increase in effective error correction rate of the ECC engine 112. Improving the effective error correction rate of the ECC engine 112 may improve the reliability of the memory device 104 and thus the life time expectancy of the memory device 104.

Figure 2:
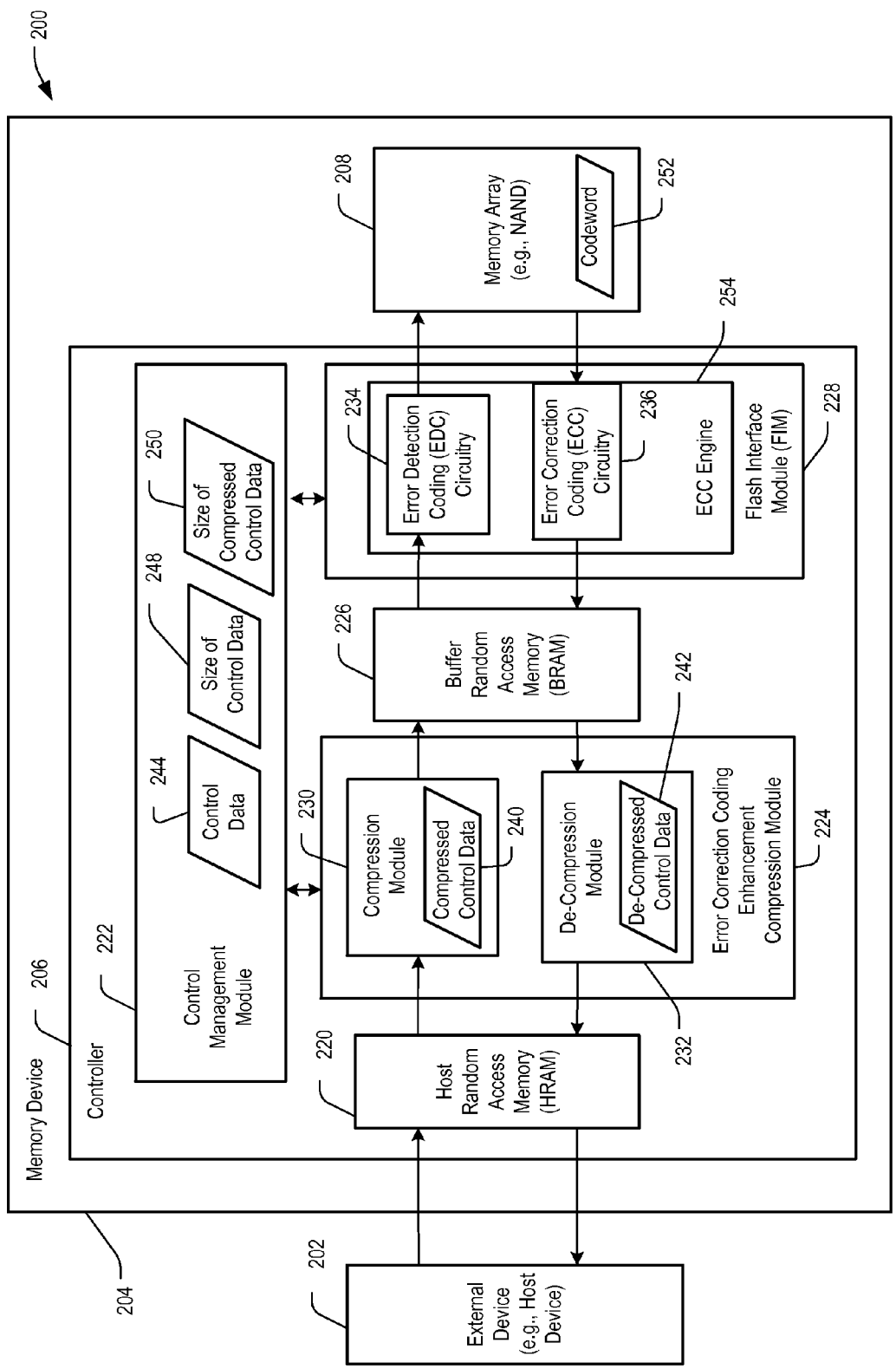
FIG. 2 is a block diagram of a second illustrative embodiment of a system that includes a memory device with an ECC enhancement compression module.

Referring to FIG. 2, a particular embodiment of a system is depicted and generally designated 200. The system 200 includes an external device 202, such as a host device. The external device 202 is coupled to a memory device 204. The memory device 204 includes an error correction coding (ECC) enhancement compression module 224 coupled to an ECC engine 254 to store compressed control data 240 as encoded data (e.g., codeword 252) at a memory array 208. For example, the memory device 204 may be the memory device 104 of FIG. 1.

The memory device 204 includes a controller 206 coupled to the memory array 208. The controller 206 includes a control management module 222 that is coupled to the ECC enhancement compression module 224. A host random access memory (HRAM) 220 is coupled to the ECC enhancement compression module 224 and is configured to communicate data with the external device 202. The controller 206 also includes a buffer random access memory (BRAM) 226 that is coupled to buffer data between the ECC enhancement compression module 224 and a flash interface module (FIM) 228. The flash interface module 228 is coupled to communicate data with the memory array 208.

The control management module 222 may be configured to provide control functionality to the memory device 204. The control management module 222 may be configured to generate control data 244 and other data that may be related to the control data 244, such as a size 248 of the control data 244 and a size 250 of compressed control data. The control management module 222 is coupled to the ECC enhancement compression module 224 and may be configured to provide the control data 244 to the ECC enhancement compression module 224 for compression, encoding, and storage at the memory array 208.

The ECC enhancement compression module 224 may be configured to retrieve data from the HRAM 220, such as user data provided from the external device 202, and also to retrieve the control data 244 from the control management module 222. The ECC enhancement compression module 224 includes a compression module 230 and a de-compression module 232. The compression module 230 may be configured to perform a compression operation to received data, such as user data or the control data 244. For example, the compression module 230 may be configured to perform a compression operation to the control data 244 to generate the compressed control data 240.

The de-compression module 232 may be configured to receive data stored at the BRAM 226, such as decoded data that has been read from the memory array 208, and to perform a de-compression operation to the received data. For example, the de-compression module 232 may be configured to receive decoded compressed control data from the BRAM 226 and to perform a de-compression operation to generate de-compressed control data 242.

The flash interface module 228 may be configured to receive data to be stored at the memory array 208 from the BRAM 226 and to perform data processing for storage and communication to the memory array 208. For example, the flash interface module 228 includes the ECC engine 254. The ECC engine 254 may include error detection coding (EDC) circuitry 234 and ECC circuitry 236. The ECC engine 254 may be configured to receive data to be stored at the memory array 208 and to perform an encoding operation, such as a Reed-Solomon, BCH, or LDPC encoding operation to enable detection and correction of errors occurring during transmission to and from the memory array 208 and during storage at the memory array 208.

The ECC circuitry 236 may be configured to receive data that is read from the memory array 208, which may include one or more errors, and to perform a decoding operation to detect and correct errors in the received data. During a data write operation, the EDC circuitry 234 may generate a codeword 252 that is stored at the memory array 208. For example, the EDC circuitry 234 may encode the compressed control data 240 to generate the codeword 252. Encoding at the EDC circuitry 234 may include generating ECC bits corresponding to the compressed control data 240, such as parity bits. The ECC bits may be included in the codeword 252.

The codeword 252 may be read from the memory array 208 and provided to the ECC circuitry 236 for decoding. The ECC circuitry 236 may be configured to detect one or more errors to recover the original codeword 252 and to decode the codeword 252 to generate decoded data. Decoded data that is recovered by the ECC engine 254 may be provided to the BRAM 226.

The memory array 208 may include one or more structural arrangements of storage elements. For example, the memory array 208 may be arranged with columns of memory cells and may include a bit line and a source line, such as in a NOR flash memory arrangement. As another example, the memory array 208 may be arranged with columns of memory cells in series, such as in a NAND flash memory arrangement. The memory array 208 may be a multi-banked memory and may include NAND flash memory, NOR flash memory, one or more other memory types, or any combination thereof.

The memory array 208 may operate in a multi-level cell (MLC) mode or a single level cell (SLC) mode. In the SLC mode, each memory cell may be programmed into either a "0" or a "1" state. Reading of such binary cells may be accomplished by applying a single control voltage to the control gate of an addressed memory cell so that a transistor conducts if programmed to a "1" state, but remains off in the "0" state. In the MLC mode, more than two data states may be possible for each memory cell by more finely controlling the programming of the cell. Four or more possible states are defined for each memory cell of the memory array 208 in an MLC mode. For example, the states of the memory cells may correspond to binary values 00, 01, 10, and 11. In effect, the two intermediate states may correspond to the two levels of partial programming of the cell between a fully erased and a fully programmed state. The ability to store two or more bits of data at each memory cell may double, triple, or further enhance the data capacity of the memory array 208.

During operation, the control management module 222 may generate the control data 244 to be compressed, encoded, and stored at the memory array 208. The control management module 222 may provide the control data 244 to the ECC enhancement compression module 224. The control data 244 may be compressed by the compression module 230 to generate the compressed control data 240. The size 250 of the compressed control data 240 may be compared to the size 248 of the (uncompressed) control data 244, such as at the ECC enhancement compression module 224 or at the control management module 222. In response to the size 250 of the compressed control data 240 being less than the size 248 of the control data 244, the compressed control data 240 may be provided to the BRAM 226. However, when the size 248 of the control data 244 does not exceed the size 250 of the compressed control data 240, the compression operation performed by the compression module 230 may have been ineffective, and may have increased or not changed the size 248 of the control data 244. In this case, the compression module 230 provides the un-compressed control data 244 to the BRAM 226. The data stored at the BRAM 226 may be provided to the EDC circuitry 234 of the ECC engine 254. The EDC circuitry 234 may encode the compressed control data 240, such as by generating a set of parity bits in a systematic encoding or by generating a codeword in a non-systematic encoding. The compressed encoded control data generated at the EDC circuitry 234 may be provided to the flash interface module 228 as a data word or page and may be provided to the memory array 208 for storage as the codeword 252.

The codeword 252 may be retrieved from the memory array 208, such as via a data read operation that may retrieve a formatted data word, such as will be described with respect to FIGS. 3 and 4. The retrieved codeword 252 may be provided to the error correction coding (ECC) circuitry 236. The ECC circuitry 236 may decode and correct errors in the codeword 252 to generate decoded compressed control data for storage at the BRAM 226.

The decoded compressed control data from the BRAM 226 may be provided to the de-compression module 232 that may operate on the decoded compressed control data to generate the de-compressed control data 242. The de-compressed control data 242 may be provided to the control management module 222 for control management of the memory device 204.

In addition, user data may be received from the external device 202 and buffered at the HRAM 220. The user data buffered at the HRAM 220 may be provided to the ECC enhancement compression module 224 for compression and encoding prior to storage at the memory array 208 in a manner substantially similar to the manner described with the control data 244.

The controller 206 may be configured to select an operating mode for the ECC engine 254 based on the compression ratio (CR) of the ECC enhancement compression module 224. The selection of the mode of the ECC engine 254 may be delayed until after the compression ratio is known. For example, the ECC engine 254 may have two operation modes: 12 bit correction for 22 bytes long parity and 16 bit correction for 28 bytes long parity.

As an illustrative example, a 2112 byte page in the memory array 208 may include the following portions of the following sizes:

| Structure | Length in bytes |
|---|---|
| Header | 16 |
| Header parity | 4 |
| Data 0 | 1024 |
| Parity for Data 0 | 22 |
| Data 1 | 1024 |
| Parity for Data 1 | 22 |
| Total | 2112 |

The size of the data portions may impact the ability of the controller 206 to select a particular mode of the ECC engine. For example, in a 2112 byte page of the memory array 208, if the Data 0 and Data 1 portions occupy 2048 bytes of space, with a combined header and header parity size of 20 bytes, the 2112 byte page size may only allow 22 bytes of parity for each of the data portions. Therefore, the ECC engine 254 may be prevented from using the correction capability provided by the 16 bit mode.

Compressing the data portions (e.g., Data 0 and Data 1) may enable the ECC engine 254 to use the higher 16 bit correction mode. For example, compressing the Data 0 and Data 1 portions each by 6 bytes enables the parity for Data 0 and Data 1 to each be increased by 6 bytes, enabling 28 bytes of parity for each data portion. Increasing the parity may also increase the error correction capability of the ECC engine 254. An example of a 2112 byte page having 6 byte compression of the data sections and 28 byte parity is:

| Structure | Length in bytes |
|---|---|
| Header | 16 |
| Header parity | 4 |
| Data 0 | 1018 |
| Parity for Data 0 | 28 |
| Data 1 | 1018 |
| Parity for Data 1 | 28 |
| Total | 2112 |

The controller 206 may be configured to control the (CR) of the ECC enhancement compression module 224 to achieve a predefined block error rate (BLER) in the ECC engine 254. For example, for a BCH code the BLER may be defined as:

$$BLER = Sum((p)^i * C(n,i) * (1-p)^{n-i}, i=k, n)$$

In a particular embodiment, (p) represents a maximum input bit error rate and (k) is one plus the number of bits that the ECC engine 254 is capable of correcting per (n) bits of data. The C(n, k) function is a calculation of a number of k-combinations (each of size (k)) from a set with n-elements of size (n). For example, the C(n, k) function may be defined as:

$$C(n, k) = \frac{n!}{k!(n-k)!}$$

Introducing the compression ratio (CR) into the BLER calculation yields:

$$BLER = Sum((p)^i * C(n,i) * (1-p)^{n-i}, i=k, n)$$

For example, the ECC engine 254 may be configured to correct 122 bits per 2048 bytes of data with (BLER)<$10^{11}$. Therefore, (k)=122+1=123 and (n)=2048 bytes*8 bits/byte=16,384. Solving for (p) results in:

| Compression Ratio (CR) | (p) Maximum Input BER [%] |
|---|---|
| 1 | 0.34 |
| 0.9 | 0.37 |
| 0.8 | 0.41 |
| 0.7 | 0.46 |
| 0.6 | 0.53 |
| 0.5 | 0.62 |
| 0.4 | 0.74 |
| 0.3 | 0.92 |
| 0.2 | 1.2 |

The controller 206 may be configured to control the (CR) of the ECC enhancement compression module 224. For example, the controller 206 may indicate to the ECC enhancement compression module 224 to use a (CR) of 0.8 if the desired maximum input BER (p) from the ECC engine 254 is 0.41. For example, assuming a constant maximum bit error rate probability of 0.001 and an ECC engine that can correct up to 16 errors in a 1K byte block, then (n)=8*1024 bytes=8,192 bits; (k)=17; (p)=0.001.

Solving the BLER equation for the probability of an uncorrectable error yields:

| Compression Ratio (CR) | Uncorrectable Error Probability |
|---|---|
| 0.1 | 3.58E−17 |
| 0.2 | 2.25E−12 |
| 0.3 | 1.00E−09 |
| 0.4 | 5.96E−08 |
| 0.5 | 1.18E−06 |
| 0.6 | 1.16E−05 |
| 0.7 | 7.05E−05 |
| 0.8 | 3.01E−04 |
| 0.9 | 9.86E−04 |
| 1 | 2.62E−03 |

Thus, as the compression ratio (CR) improves (i.e., is reduced), the probability of the ECC engine 254 being unable to correct all of the errors in the control data decreases. For example, a 50% compression in the ECC enhancement compression module 224 may reduce a probability of uncorrectable errors being returned by the ECC engine 254 significantly in comparison to using a compression ratio of 1. By improving the (CR), the effective error correction capability of the ECC engine 254 is increased, thus improving the reliability of the memory device 204.

Figure 3:
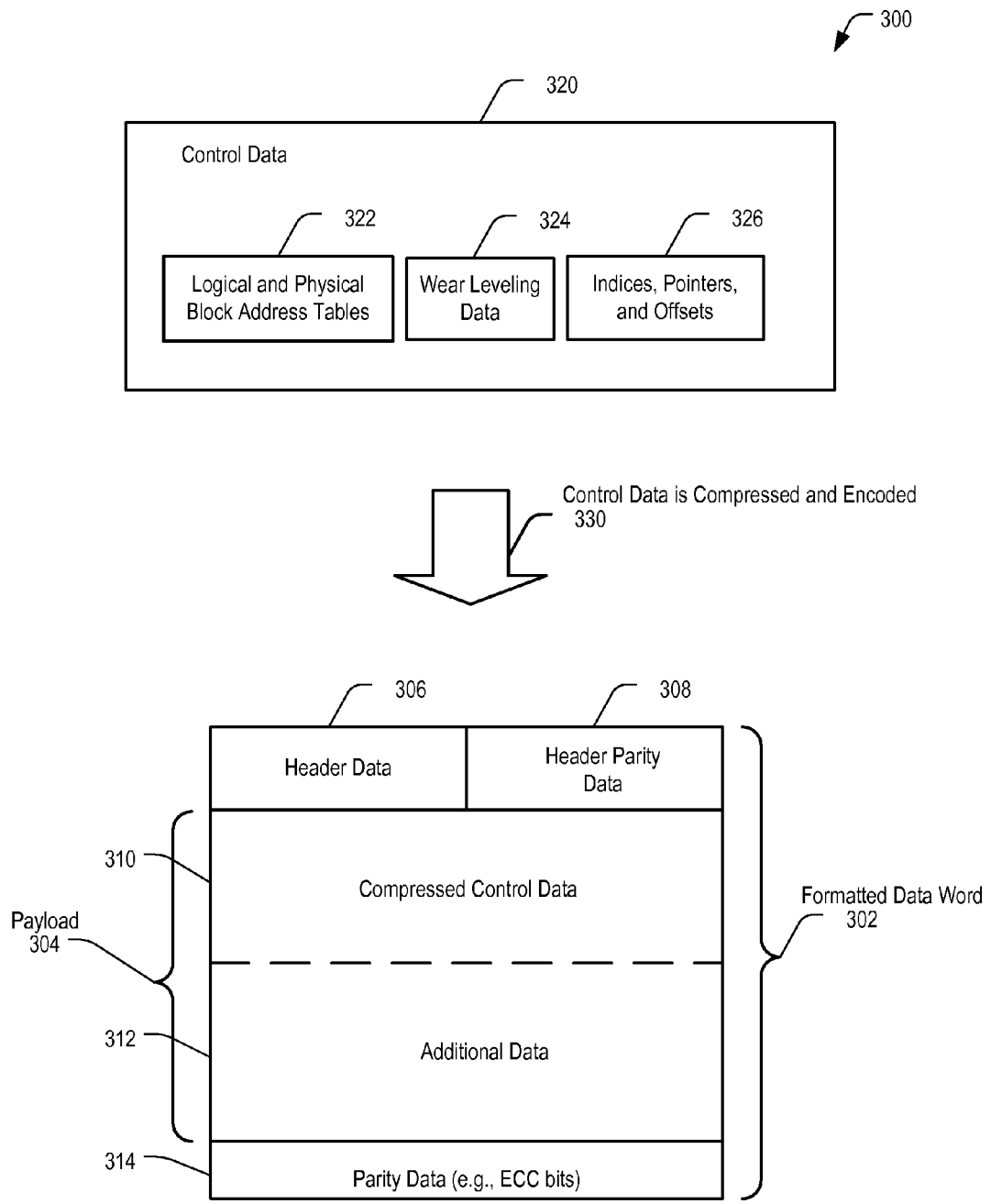
FIG. 3 is a block diagram of an illustrative embodiment of control data and a formatted data word that includes compressed and encoded control data.

Referring to FIG. 3, control data 320 and a formatted data word 302 are depicted and generally designated 300. The control data 320 may include logical and physical block address tables 322, wear leveling data 324, and data structure information, such as indices, pointers, and offsets 326.

The control data 320 may be compressed and encoded 330 into a formatted data word 302. The formatted data word 302 may include header data 306, header parity data 308, compressed control data 310, additional data 312, and parity data 314, such as for example, ECC bits. The payload of the formatted data word 302 may include the compressed control data 310 and the additional data 312.

The additional data 312 is added to the compressed control data 310 to increase a storage size of the formatted data word 302 to a predetermined size. To illustrate, the formatted data word 302 may be a 2112 byte page. The additional data 312 may be added after decoding of the compressed control data. The additional data 312 may be selected or generated to reduce data dependent program failures. For example, the additional data 312 may include a pattern based on the parity data 314, such as a repeating pattern of the parity data 314.

The additional data 312 may be discarded during a decoding stage. For example, the additional data 312 may be identified based on a size of the compressed control data 310 that indicates a size of the compressed control data 310 without the additional data 312. For example, the ECC engine 254 or the ECC enhancement compression module 224 of FIG. 2 may determine the size 250 of the compressed control data 310 before the addition of the additional data 312 and may store the size 250 of the compressed control data at the control management module 222. Alternatively, the size 250 of the compressed control data may be stored at the header data 306, at the controller 206 of FIG. 2, such as in a log file (not shown), or at another location. The ECC engine 254 may retrieve the size 250 of the compressed control data to discard the additional data 312 before decoding the formatted data word 302.

Figure 4:
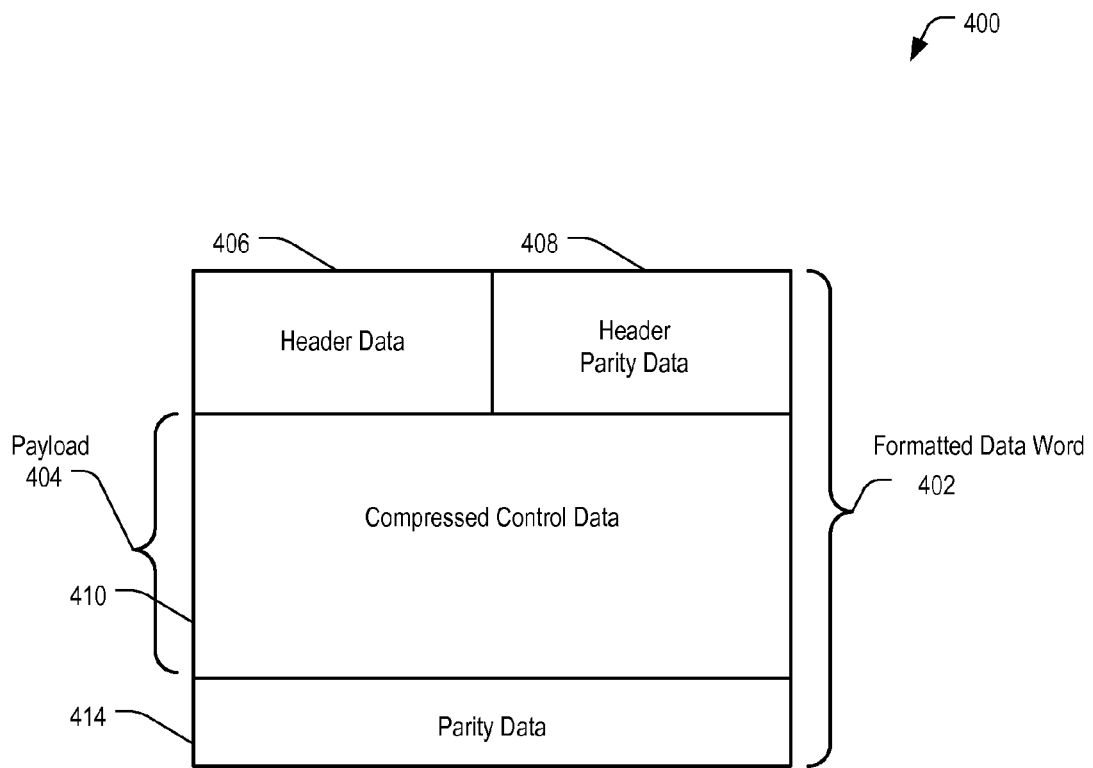
FIG. 4 is a block diagram of a second illustrative embodiment of a formatted data word that includes compressed and encoded control data.

Referring to FIG. 4, a variable-sized formatted data word 402 may include header data 406, header parity 408, compressed control data 410, and parity data 414. The compressed control data 410 may include the payload 404 of the variable-sized formatted data word 402. The payload 404 does not include additional data, such as the additional data 312 of FIG. 3 to expand the variable-sized formatted data word 402 to a predetermined size.

Storing the compressed control data 410 without adding additional data may result in a variable-sized formatted data word 402 that is stored in a memory array, such as the memory array 108 or 208 of FIGS. 1-2. Variable-sized formatted data words may save space in the memory array and may increase an efficiency of data storage in the memory array.

Figure 5:
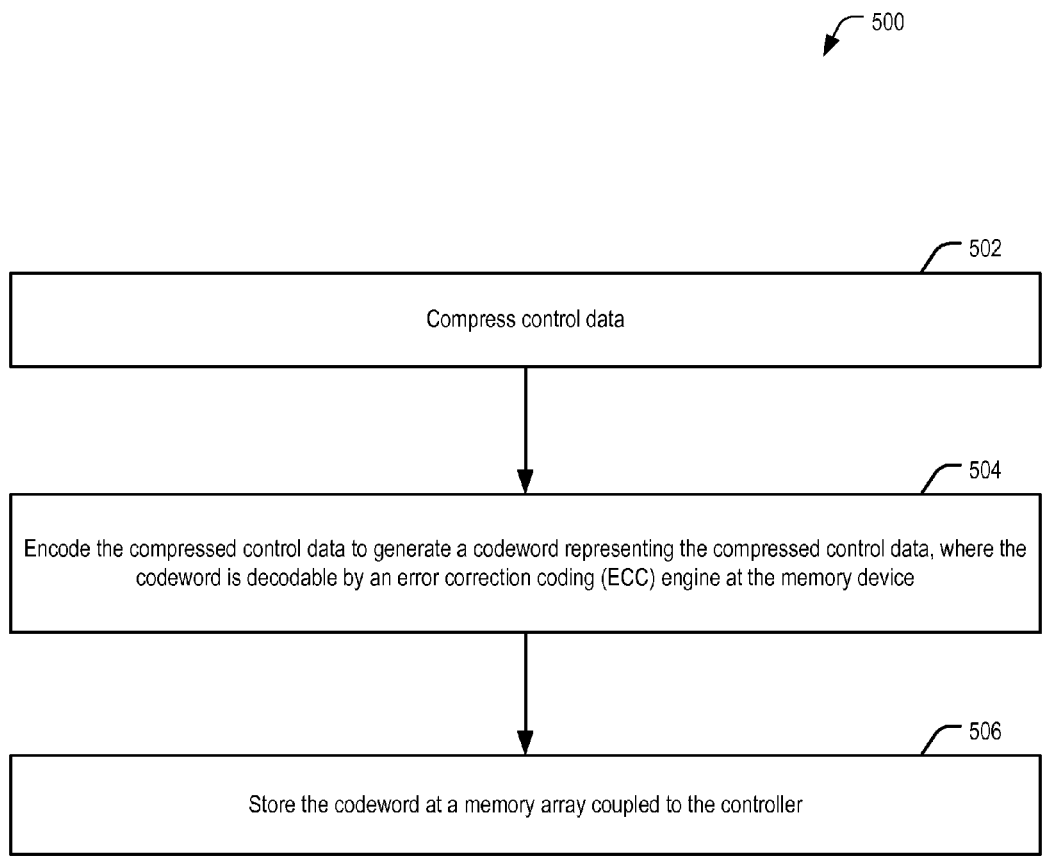
FIG. 5 is a flow chart of an illustrative embodiment of a method of enhancing error correction of control data at a memory device.

FIG. 5 is a flow diagram of an embodiment of a method 500 of compressing and encoding control data. The method 500 is performed at a controller of a memory device, such as the controller 106 of FIG. 1 or the controller 206 of FIG. 2, as illustrative, non-limiting examples. The method 500 includes compressing control data, at 502. For example, the error correction coding (ECC) enhancement compression module 224 of FIG. 2 compresses the control data 244. The method 500 may also include receiving user data from an external device coupled to the memory device. The external device may be a host device and the user data may be received at a host random access memory (HRAM) at the memory device. For example, the HRAM 220 of FIG. 2 may receive user data from the external device (e.g., host device) 202. The control data may be generated at the controller. The control data may comprise data of a type selected from the group consisting of logical and physical block address tables for the memory array at the memory device; indices, pointers, and offsets for data structures at the memory array; and wear leveling data for the memory device. For example, the controller 206 of FIG. 2 may generate the control data 244.

The method 500 also includes encoding the compressed control data to generate a codeword representing the compressed control data, at 504. The codeword is decodable by an error correction coding (ECC) engine at the memory device. For example, the ECC engine 254 of FIG. 2 encodes the compressed control data 240 to generate the codeword 252 representing the compressed control data 240. The compressed control data may be stored at a buffer random access memory (BRAM). For example, the BRAM 226 of FIG. 2 may store the compressed control data 240. An effective error correction rate of the compressed control data at the ECC engine may exceed an effective error correction rate of the control data. For example, the ECC engine 254 of FIG. 2 may have an effective error correction rate of the compressed control data 240 that exceeds the effective error correction rate of the control data 244. Encoding the compressed control data may include generating ECC bits corresponding to the compressed control data. The encoding may be based on a Reed-Solomon code, a Bose Ray-Chaudhuri Hocquenghem (BCH) code, or a Low Density Parity Check (LDPC) code.

The method 500 also includes storing the codeword at a memory array coupled to the controller, at 506. For example, the controller 206 of FIG. 2 stores the codeword 252 at the memory array 208 coupled to the controller 206. Storing the codeword may include storing a formatted data word that includes a header data portion, a payload portion, and a parity portion. The formatted data word may further include a header parity portion. For example, the formatted data word 302 of FIG. 3 includes the header data 306, the payload 304, the parity data 314, and the header parity data 308.

The method 500 may include adding additional data to the compressed control data to increase a storage size of the formatted data word to a predetermined size. The additional data may be added to the compressed control data after the compressed control data is encoded. For example, the controller 206 of FIG. 2 may add the additional data 312 of FIG. 3 to the compressed control data 310 of the formatted data word 302. Alternatively, the compressed control data may be encoded without the additional data to generate a variable sized formatted data word, such as the formatted data word 402 of FIG. 4.

The method 500 may include storing a size of the compressed control data. For example, the size may be stored at the header data portion, such as at the header data 306 of the formatted data word 302 of FIG. 3. As another example, the size of the compressed control data may be stored at the memory array. For example, the controller 206 of FIG. 2 may store the size 250 of the compressed control data 240 at the memory array 208. The size of the compressed control data may be stored at the controller, such as the size 250 of the compressed control data 240 at the controller 206 of FIG. 2. The method 500 may also include comparing a first size of the control data to a second size of the compressed control data and in response to the second size exceeding or equaling the first size, providing the control data to the ECC engine to be encoded. For example, the controller 206 of FIG. 2 may compare the size 248 of the control data 244 to the size 250 of the compressed control data 240 and may provide the control data 244 to the ECC engine 254 to be encoded in response to the size 250 of the compressed control data exceeding or equaling the size 248 of the control data. As another example, the compressed control data 240 may be provided to the ECC engine 254 in response to the size 248 of the control data exceeding the size 250 of the compressed control data.

Figure 6:
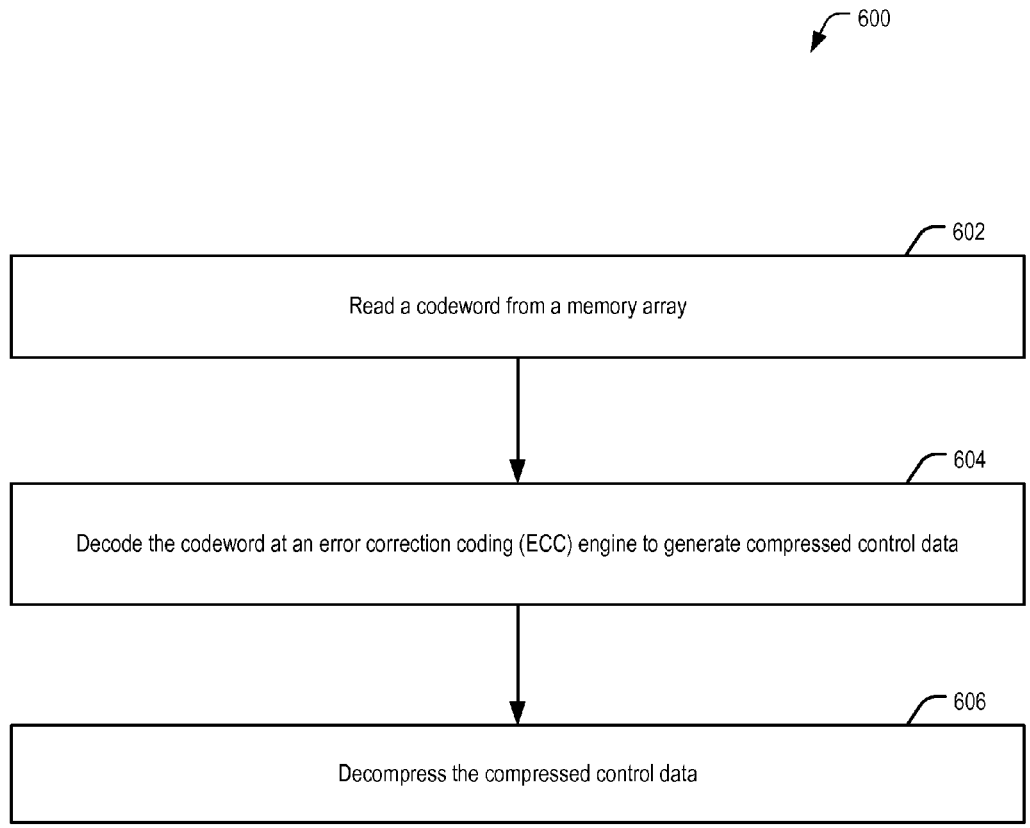
FIG. 6 is a flow chart of a second illustrative embodiment of a method of enhancing error correction of control data at a memory device.

FIG. 6 is a flow diagram of an embodiment of a method 600 of decoding and de-compressing control data. The method 600 may be performed at a controller of a memory device, such as the controller 106 of FIG. 1 or the controller 206 of FIG. 2, as illustrative, non-limiting examples. The method 600 includes reading a codeword from a memory array, at 602. For example, the controller 206 of FIG. 2 reads the codeword 252 from the memory array 208. The method 600 also includes decoding the codeword at an error correction coding (ECC) engine to generate compressed control data, at 604. For example, the ECC engine 254 of FIG. 2 decodes the codeword 252 to generate compressed control data 240. The method 600 also includes de-compressing the compressed control data, at 606. For example, the ECC enhancement compression module 224 of FIG. 2 de-compresses compressed control data to generate the decompressed control data 242.

The compressed control data may include additional data. The additional data may be discarded from the compressed control data based on a size of the compressed control data. For example, the controller 206 of FIG. 2 may discard the additional data 312 from the compressed control data 310 of FIG. 3 based on the size 250 of the compressed control data 240. The size of the compressed control data may indicate a size of the compressed control data without the additional data.

The method 600 may also include retrieving the size of the compressed control data from the memory array. For example, the controller 206 of FIG. 2 may retrieve the size 250 of the compressed control data 240 from the memory array 208. Alternatively, or in addition, the size of the compressed control data may be returned from the controller. For example, the controller 206 of FIG. 2 may retrieve the size 250 of the compressed control data 240 from the controller 206.

With the additional data removed from the compressed control data, the controller may de-compress the compressed control data for use in the operation of the memory device. Performing error correction decoding on compressed control data may enable the error correction capabilities of the ECC engine to be increased by narrowing the area of correction efforts. For example, an effective error correction rate of the compressed control data at the ECC engine may exceed an effective error correction rate of the control data.

Although various components depicted herein are illustrated as block components and described in general terms, such components may include one or more microprocessors, state machines, or other circuits configured to enable the memory device 104 of FIG. 1 or the memory device 204 of FIG. 2 to perform the particular functions attributed to such components, or any combination thereof. For example, the ECC enhancement compression module 110 of FIGS. 1 and 224 of FIG. 2 may represent physical components, such as hardware controllers, state machines, logic circuits, or other structures to enable the memory device 104 of FIG. 1 to compress control data to be encoded for storage.

As another example, the controller 106 of FIG. 1 may be implemented using dedicated circuitry configured to perform compression and de-compression of control data at an ECC enhancement compression module 110, encoding and decoding of compressed control data at an ECC engine 112, and retrieving and storing of codewords at a memory array 108. Alternatively, or in addition, the controller 106, or portions of the controller 106, may be implemented using a microprocessor or microcontroller programmed to perform compression, de-compression, encoding, decoding, or any combination thereof. The memory device 104 may include executable instructions that are executed by a processor and the instructions may be stored at the memory array 108, such as a flash memory array. Alternatively, or in addition, executable instructions that are executed by a processor that may be included in the memory device 104 may be stored at a separate memory location that is not part of the memory array 108, such as at a separate random access memory (RAM) (not shown) or a read-only memory (ROM) (not shown).

The memory device 104 of FIG. 1 may be a portable device configured to be selectively coupled to one or more external devices, such as a host device. However, in other embodiments, the memory device 104 may be attached or embedded within one or more host devices, such as within a housing of a portable communication device. For example, the memory device 104 may be within a packaged apparatus, such as a wireless telephone, a personal digital assistant (PDA), a gaming device or console, a portable navigation device, or other device that uses internal non-volatile memory. The memory device 104 may include a non-volatile memory, such as a flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of non-volatile memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a memory device including an error correction coding (ECC) engine and multiple storage elements including a group of storage elements, wherein the memory device is configured to store information to the storage elements according to a page format, the page format including a data portion and a parity portion, performing:
   initiating a compression operation to compress data to be stored in the group of storage elements;
   selecting one of a first mode of the ECC engine to generate a first number of parity bits and a second mode of the ECC engine to generate a second number of parity bits, the selected mode based on an extent of compression of the compressed data;
   encoding the compressed data to generate parity bits corresponding to the compressed data; and
   adding additional data to the compressed data to increase a storage size of a formatted word;
   storing the formatted word including the compressed data and the parity bits to the group of storage elements according to the page format, wherein the compressed data is stored in the data portion and at least some of the parity bits are stored in the parity portion.

2. The method of claim 1, wherein the first number of parity bits corresponds to a size of the parity portion and wherein the second number of parity bits is greater than the size of the parity portion.

3. The method of claim 2, wherein when the second mode is selected a first portion of the parity bits is stored in the parity portion and a second portion of the parity bits is stored in the data portion.

4. The method of claim 3, wherein the second mode is selected in response to the data portion having sufficient space to include the compressed data and the second portion of the parity bits.

5. The method of claim 1, wherein the compressed data is encoded using the ECC engine in the selected mode.

6. The method of claim 1, wherein the memory device includes a controller and wherein the data includes control data generated at the controller.

7. The method of claim 6, wherein the control data comprises data of a type selected from the group consisting of logical and physical block address tables for the storage elements; indices, pointers, and offsets for data structures at the memory device; and wear leveling data for the memory device.

8. A method comprising:
   in a memory device including an error correction coding (ECC) engine and multiple storage elements, wherein the memory device is configured to store information at the storage elements according to a page format, the page format including a data portion and a parity portion, performing:
   reading a page of data including compressed data and parity bits from the storage elements according to the page format wherein the page of data includes additional data added to the compressed data to increase a storage size of a formatted word, wherein the compressed data is included in the data portion of the page and at least some of the parity bits are included in the parity portion of the page;
   decoding the compressed data at the ECC engine using the parity bits; and
   decompressing the compressed data to generate decompressed data,
   wherein the ECC engine is configurable to operate according to a first mode when all of the parity bits are included in the parity portion of the page or to operate according to a second mode when a first portion of the parity bits is included in the parity portion of the page and a second portion of the parity bits is included in the data portion of the page.

9. The method of claim 8, wherein the memory device includes a controller and wherein the decompressed data includes control data generated at the controller.

10. The method of claim 9, wherein the control data comprises data of a type selected from the group consisting of logical and physical block address tables for the storage elements; indices, pointers, and offsets for data structures at the memory device; and wear leveling data for the memory device.

11. A data storage device comprising:
   a memory including multiple storage elements; and
   a controller coupled to the memory and configured to store information to the storage elements according to a page format, the page format including a data portion and a parity portion, wherein the controller comprises:
   an error correction coding (ECC) engine; and
   a compression module coupled to the ECC engine and configured to receive and compress data provided to the ECC engine for encoding,
   wherein the ECC engine is configurable to operate in a first mode to generate a first number of parity bits or to operate in a second mode to generate a second number of parity bits based on an extent of compression of the data, and
   wherein the controller is configured to store a page including the compressed data and parity bits to the storage elements according to the page format, wherein the compressed data is stored in the data portion of the page and at least some of the parity bits are stored in the parity portion of the page, and wherein the controller is configured to add additional data to the compressed data to increase a storage size of a formatted word.

12. The data storage device of claim 11, wherein the ECC engine further comprises:
   error detection coding circuitry configured to encode compressed data; and
   error correction coding circuitry configured to decode the encoded compressed data.

13. The data storage device of claim 11, wherein the first number of parity bits corresponds to a size of the parity portion of the page and wherein the second number of parity bits is greater than the size of the parity portion of the page.

14. The data storage device of claim 13, wherein when the ECC engine operates in the second mode a first portion of the parity bits is stored in the parity portion and a second portion of the parity bits is stored in the data portion.

15. The data storage device of claim 14, wherein the second mode is selected in response to the data portion having sufficient size to include the compressed data and the second portion of the parity bits.

16. The data storage device of claim 11, wherein the controller is further configured to generate control data and wherein the received data includes the control data.

17. The data storage device of claim 16, wherein the control data comprises data of a type selected from the group consisting of logical and physical block address tables for the memory; indices, pointers, and offsets for data structures at the memory; and wear leveling data for the data storage device.

18. The data storage device of claim 11, wherein the memory includes a flash memory.

19. A data storage device comprising:
a memory including multiple storage elements; and
a controller coupled to the memory and configured to read information from the storage elements according to a page format, the page format including a data portion and a parity portion, wherein the controller comprises:
an error correction coding (ECC) engine; and
a decompression module coupled to the ECC engine and configured to receive and decompress decoded data provided by the ECC engine,
wherein the ECC engine is operative to decode a page of compressed data and parity bits read from the memory according to the page format, wherein the compressed data is included in the data portion of the page and at least some of the parity bits are included in the parity portion of the page, and wherein the controller is configured to add additional data to the compressed data to increase a storage size of a formatted word, and
wherein the ECC engine is configured to operate according to a first mode when all of the parity bits are included in the parity portion of the page or to operate according to a second mode when a first portion of the parity bits is included in the parity portion of the page and a second portion of the parity bits is included in the data portion of the page.

20. The data storage device of claim 19, wherein the decompressed decoded data includes control data usable by the controller.

21. The data storage device of claim 19, wherein the memory includes a flash memory.

* * * * *